United States Patent
Huang et al.

(10) Patent No.: US 12,119,402 B2
(45) Date of Patent: Oct. 15, 2024

(54) SEMICONDUCTOR DEVICES WITH FERROELECTRIC LAYER AND METHODS OF MANUFACTURING THEREOF

(71) Applicant: Taiwan Semiconductor Manufacturing Company, Ltd., Hsinchu (TW)

(72) Inventors: Yen-Chieh Huang, Hsinchu (TW); Po-Ting Lin, Hsinchu (TW); Hai-Ching Chen, Hsinchu (TW); Sai-Hooi Yeong, Zhubei (TW); Yu-Ming Lin, Hsinchu (TW); Chung-Te Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/308,791

(22) Filed: Apr. 28, 2023

(65) Prior Publication Data
US 2023/0268438 A1 Aug. 24, 2023

Related U.S. Application Data

(62) Division of application No. 17/460,096, filed on Aug. 27, 2021, now Pat. No. 11,670,715.

(51) Int. Cl.
*H01L 29/78* (2006.01)
*H01L 29/49* (2006.01)
(Continued)

(52) U.S. Cl.
CPC .... *H01L 29/78391* (2014.09); *H01L 29/4908* (2013.01); *H01L 29/78642* (2013.01); *H01L 29/78693* (2013.01); *H10B 51/20* (2023.02)

(58) Field of Classification Search
CPC ........ H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22; H01L 23/5226; H01L 23/528; H01L 29/41775; H01L 29/42324; H01L 29/4234; H01L 21/02532; H01L 21/02636; H01L 21/31111; H01L 21/31155;
(Continued)

(56) References Cited

U.S. PATENT DOCUMENTS

| | | | |
|---|---|---|---|
| 2005/0205920 A1* | 9/2005 | Jeon | H01L 21/31616 257/E21.21 |
| 2018/0151746 A1 | 5/2018 | Tu et al. | |

\* cited by examiner

*Primary Examiner* — Moin M Rahman
(74) *Attorney, Agent, or Firm* — FOLEY & LARDNER LLP

(57) ABSTRACT

A semiconductor device is described. The semiconductor device includes a substrate and a metal layer disposed on the substrate. A seed layer is formed on the metal layer. A ferroelectric gate layer is formed on the seed layer. A channel layer is formed over the ferroelectric gate layer. The seed layer is arranged to increase the orthorhombic phase fraction of the ferroelectric gate layer.

20 Claims, 12 Drawing Sheets

(51) Int. Cl.
*H01L 29/786* (2006.01)
*H10B 51/20* (2023.01)

(58) Field of Classification Search
CPC ......... H01L 21/76802; H01L 21/76877; H01L 21/76897; H01L 29/40114; H01L 29/40117; H01L 29/66545; H01L 29/7883; H01L 21/76831; H01L 21/76805; H01L 29/78; H01L 21/823821; H01L 21/845; H01L 29/1054; H01L 29/66803; H01L 29/7853; H01L 29/7854; H01L 29/51; H01L 29/10; H01L 21/28; H01L 21/823857; H01L 21/28194; H01L 29/513; H01L 29/517; H01L 21/823431; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 29/02–1608; H01L 29/78391; H01L 27/11597; H01L 29/4908; H01L 29/78642; H01L 29/78693; H01L 21/31051; H01L 27/0207; H01L 29/0649; H01L 21/32115; H01L 21/823828; H01L 29/66681; H01L 29/0657; H01L 29/4966; H01L 29/0882; H01L 29/4983; H01L 29/1037; H01L 29/0653; H01L 29/66659; H01L 29/7835; H01L 29/66689; H01L 29/7816; H01L 21/28088

See application file for complete search history.

SEMICONDUCTOR DEVICES WITH FERROELECTRIC LAYER AND METHODS OF MANUFACTURING THEREOF

CROSS-REFERENCE TO RELATED APPLICATIONS

This application is a Divisional of U.S. application Ser. No. 17/460,096, filed Aug. 27, 2021, the disclosure of which is incorporated herein by reference in its entirety.

BACKGROUND

This disclosure relates generally to a semiconductor device, and in some embodiments, to devices that include a ferroelectric gate layer.

Field effect transistor (FET) ferroelectric random access memories (FeRAMs) are semiconductor devices which operate based on a ferroelectric material in the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13-17 show an enlarged view in a trench region of the semiconductor device.

DETAILED DESCRIPTION

Figure 1:
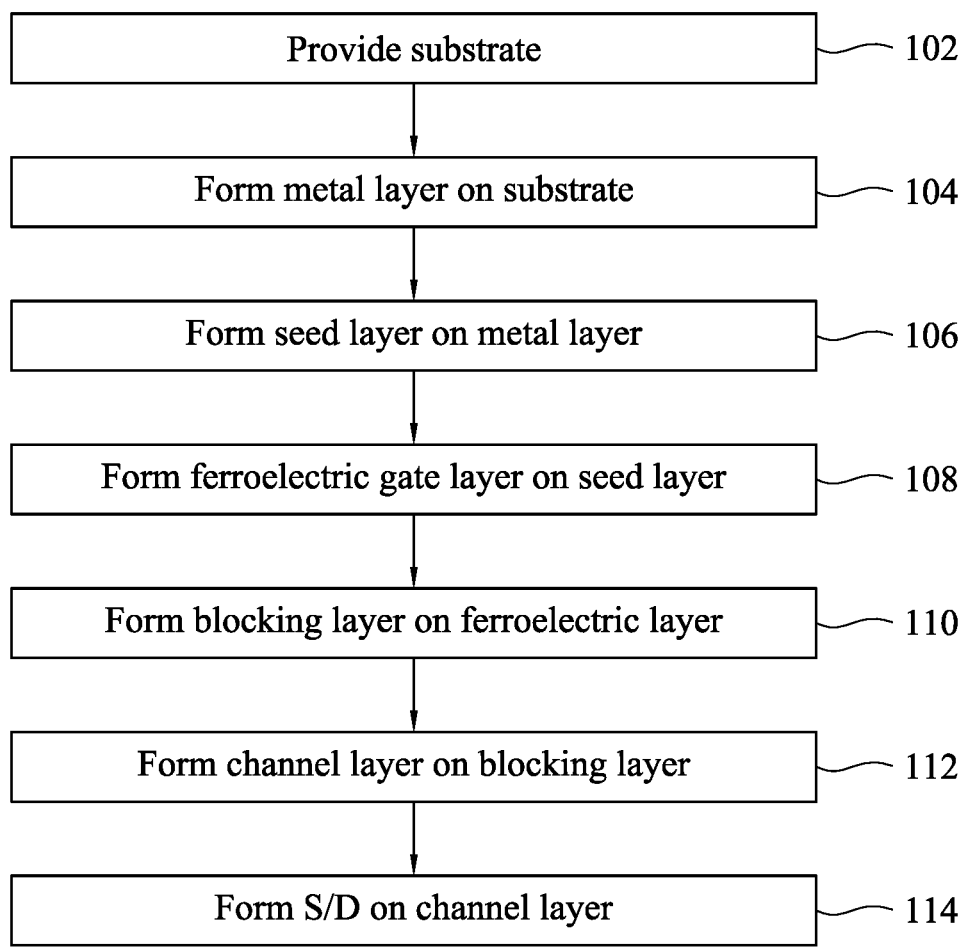
FIG. 1 illustrates a flow chart of an example method to make a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device, which may include two-dimensional FET FeRAMs, as well as three-dimensional FET FeRAMs, for example.

Embodiments of the present disclosure are discussed in the context of a semiconductor device with a number of layers formed over a substrate. A metal layer may be disposed on the substrate. In some embodiments a seed layer may be formed on the metal layer, and a ferroelectric gate layer formed on the seed layer. A channel layer may be formed over the ferroelectric gate layer. In some embodiments the seed layer may be arranged to increase the orthorhombic phase fraction of the ferroelectric gate layer.

In other embodiments, alternative to including a seed layer, or in addition to including the seed layer, a blocking layer is disposed on the ferroelectric gate layer and the channel layer is disposed on the blocking layer, where the blocking layer is arranged to increase the band offset (whether conduction band offset or valence band offset) between the blocking layer and the channel layer, and to reduce oxygen vacancies in the channel layer.

A semiconductor device arranged with the seed layer and/or the blocking layer can advantageously improve the properties of the device. Disposing the seed layer below the ferroelectric gate layer, where the seed layer is arranged to increase the orthorhombic phase fraction of the ferroelectric gate layer, beneficially increases the remanent polarization $2P_r$ of the ferroelectric gate layer. Further, disposing the blocking layer between the ferroelectric gate layer and the channel layer where the blocking layer is arranged to increase the band offset between the blocking layer and the channel layer, and to reduce oxygen vacancies in the channel layer, also provides benefits. The lower oxygen vacancies reduce the charge carrier scattering effect in the channel layer. Increasing the band offset between the blocking layer and the channel layer reduces carrier leakage current from the channel layer and gate dielectrics/ferroelectric layer.

FIG. 1 illustrates a flowchart of a method 100 to form a semiconductor device with a ferroelectric gate layer, according to one or more embodiments of the present disclosure. For example, at least some of the operations (or steps) of the method 100 can be used to form a two-dimensional FET FeRAM (or a three-dimensional FET FeRAM) in some embodiments.

FIG. 1 illustrates a flowchart of a method 100 to form a semiconductor device according to one or more embodiments of the present disclosure. It is noted that the method 100 is merely an example, and is not intended to limit the present disclosure. In some embodiments, the semiconductor device includes, at least part of, a FET FeRAM, but can include other FeRAMs while remaining within the scope of the present disclosure.

Referring to FIG. 1, the method 100 starts with operation 102 in which a substrate is provided. The method 100 continues to operation 104 in which a metal layer is formed on the substrate. The method 100 continues to operation 106 in which a seed layer is formed on the metal layer. The method 100 continues to operation 108 in which a ferroelectric gate layer is formed on the seed layer. The method 100 continues to operation 110 in which a blocking layer is formed on the ferroelectric gate layer. The method 100 continues to operation 112 in which a channel layer is formed on the blocking layer. The method 100 continues to operation 114 in which source and drain electrodes are formed on the channel layer, and metallization is formed on the source and drain electrodes.

Figure 2:
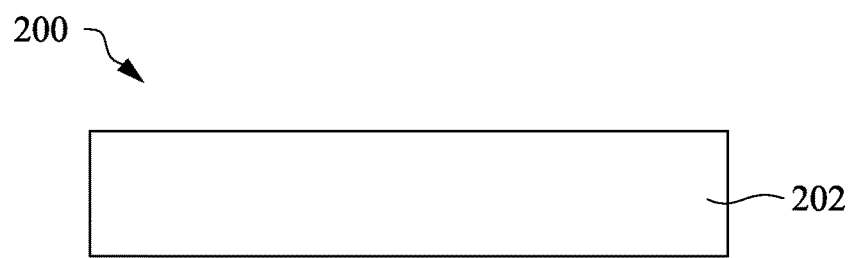
FIGS. 2-8 illustrate cross-sectional views of a semiconductor device, made by the method of FIG. 1, during various fabrication stages in accordance with some embodiments.

Corresponding to operation 102 of FIG. 1, FIG. 2 is a view of the semiconductor device 200 including a substrate 202 at one of the various stages of fabrication, according to some embodiments. The substrate 202 may be a semiconductor substrate, such as a bulk semiconductor, or a semiconductor-on-insulator (SOI) substrate, for example. The substrate 202 may be insulating, for example.

Figure 3:
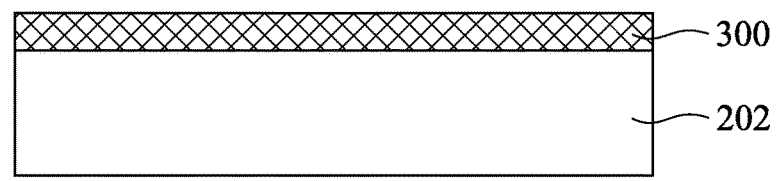

Corresponding to operation 104 of FIG. 1, FIG. 3 is a view of the semiconductor device 200 including a metal layer 300 formed on the substrate 202. The metal layer 300 may be formed on the substrate 202 by depositing the metal layer 300, such as by a physical vapor deposition (PVD) or a chemical vapor deposition (CVD) process. The metal layer 300 may be formed, for example, by an atomic layer deposition (ALD) process. The metal layer 300 may be formed of a barrier material, for example Ti, TiN, TiC, Ru, W, $WSi_x$, $RuO_2$, Pt, Nb, Mo, Cu, $WN_x$ (x from 0 to 1), Au, $FeO_x$, Ni or TaN. The metal layer 300 may be a single layer, or may be a multi-layer structure.

After deposition of the metal layer 300, the metal layer 300 may be patterned. The metal layer 300 may be patterned before subsequent layers are formed, or alternatively, the metal layer 300 and subsequent layers may be patterned in the same process. The metal layer 300 may be patterned using a photolithographic process, for example, using patterned photoresist, and/or a patterned hard mask as an etch mask.

Figure 4:
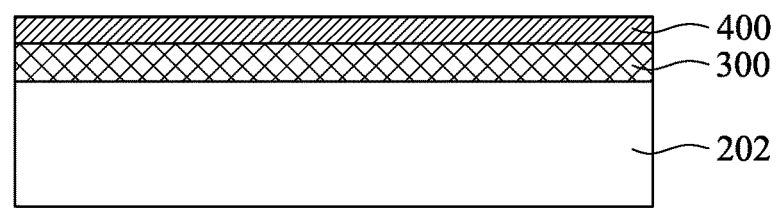

Corresponding to operation 106 of FIG. 1, FIG. 4 is a view of the semiconductor device 200 including a seed layer 400 formed on the metal layer 300. The seed layer 400 may be formed on the metal layer 300 by a deposition process, such as by a PVD or a CVD process, for example. The seed layer 400 may be formed, for example, by an ALD process.

The seed layer 400 may be formed of, for example, at least one of $ZrO_2$, $Y_2O_3$, $HfO_2$, $Ta_2O_5$ or $Al_2O_3$, crystallized $Hf_xZr_{1-x}O_2$ either alone, or in any combination. The seed layer 400 may have, for example, a thickness in the range of 0.1 nm to 5 nm. The composition of the seed layer 400 may depend on the composition of the ferroelectric gate layer 500 (see FIG. 5). For a ferroelectric gate layer 500 of $Hf_xZr_{1-x}O_y$, the seed layer 400 may have an orthorhombic crystalline phase or tetragonal crystalline phase similar to the $Hf_xZr_{1-x}O_y$ orthorhombic phase. In this case, the seed layer 400 may include, for example, $ZrO_2$, $ZrO_x$ (x from 1 to 2), $ZrO_2$—$Y_2O_3$, $Al_2O_3$, $Ta_2O_5$, $TaO_x$ (x from 1 to 2.5), crystalized $Hf_xZr_{1-x}O$ or $HfO_x$ (x from 1 to 2), $HfO_2$. For a ferroelectric gate layer 500 of AlN:Sc, the seed layer 400 may be crystallized AlN.

The seed layer 400 may be a single layer, or may have a multi-layer structure, such as a bi-layer structure. The bi-layer structure may include a first layer which is an amorphous buffer layer, and a second layer which is crystallized including an orthorhombic crystalline phase. The amorphous buffer layer may include, for example, $HfO_2$ or $ZrO_2$, $Al_2O_3$ or $Hf_xZr_{1-x}O$ (x from 0 to 1). The second layer may include, for example, $ZrO_2$, $ZrO_x$ (x from 1 to 2), $ZrO_2$—$Y_2O_3$, $Al_2O_3$, $Hf_xZr_{1-x}O$ (x from 0 to 1) or $HfO_x$ (x from 1 to 2), $HfO_2$, for example. The seed layer 400 may include a thin amorphous buffer or blocking layer contacting the metal layer 300, and disposed between the metal layer 300 and a crystallized portion of the seed layer. The thin amorphous buffer or blocking layer may include, for example, $HfO_2$, $ZrO_2$, $Al_2O_3$, MgO, SrO, $Ta_2O_5$, or $HfO_2$:Si, $SiO_2$, or in any combination, and may have a thickness of about 0.1 nm to 1 nm, for example. The thin amorphous buffer or blocking layer may be doped with Si, Al, Mg, La, Sr, Gd, N, Sc, Ca or Y, for example.

The seed layer 400 may include cubic-phase and/or tetragonal-phase and/or orthorhombic-phase Zr oxide. The seed layer 400 may include cubic-phase and/or tetragonal-phase and/or orthorhombic-phase Zr—Y oxide. The seed layer 400 may include cubic-phase, and/or tetragonal-phase and/or orthorhombic-phase $ZrO_2$. The seed layer 400 may include cubic-phase and/or tetragonal-phase and/or orthorhombic-phase $ZrO_2$—$Y_2O_3$. The seed layer 400 may include cubic-phase, tetragonal-phase and/or orthorhombic-phase $HfO_2$. The seed layer 400 may include cubic-phase, tetragonal-phase and/or orthorhombic-phase $Al_2O_3$. The seed layer 400 may include cubic-phase, tetragonal-phase and/or orthorhombic-phase $Ta_2O_5$. The seed layer 400 may include cubic-phase, tetragonal-phase and/or orthorhombic-phase $Hf_xZr_{1-x}O_y$, where x may vary from 0 to 1, or any combination of the above.

After deposition of the seed layer 400, the seed layer 400 may be patterned. The seed layer 400 may be patterned before subsequent layers are formed, or alternatively, the seed layer 400 and subsequent layers may be patterned in the same process. The metal seed layer 400 may be patterned using a photolithographic process, for example, using patterned photoresist, and/or a patterned hard mask as an etch mask.

Figure 5:
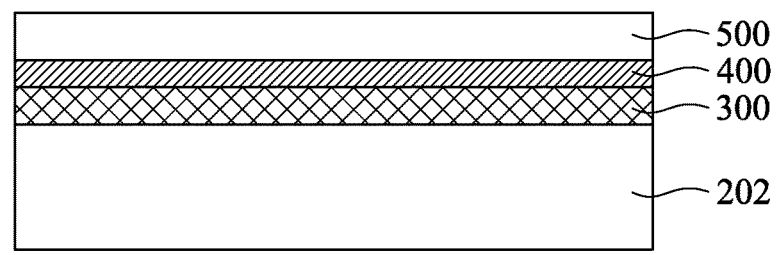

Corresponding to operation 108 of FIG. 1, FIG. 5 is a view of the semiconductor device 200 including a ferroelectric gate layer 500 formed on the seed layer 400. The ferroelectric gate layer 500 may be formed on the seed layer 400 by depositing the ferroelectric gate layer 500, such as by a PVD or CVD process. The ferroelectric gate layer 500 may be formed by, for example, an ALD process. The ferroelectric gate layer 500 may be formed, for example, by ALD at a temperature, for example, of about 100 to 600° C.

The ferroelectric gate layer 500 may be formed of, for example, $Hf_xZr_{1-x}O_y$, or AlN, or AlN:Sc. The ferroelectric gate layer 500 may be formed at a thickness of between 0.1 and 100 nm, for example. For a ferroelectric gate layer 500 of $Hf_xZr_{1-x}O_y$, x may be between 0 and 1. The ferroelectric gate layer 500 of $Hf_xZr_{1-x}O_y$ may include, for example, oxygen vacancies.

The phase fraction relationship of the ferroelectric gate layer 500, which may be $Hf_{0.5}Zr_{0.5}O_y$, may be as follows where (O+T+C) is greater than 50% M, wherein O is the orthorhombic fraction of the ferroelectric gate layer, T is the tetragonal fraction of the ferroelectric gate layer 500, C is the cubic fraction of the ferroelectric gate layer, and M is the monoclinic fraction of the ferroelectric gate layer 500. In general, the seed layer 400 may be arranged to increase the ratio of (O+T+C)/(O+T+C+M) of the ferroelectric gate layer 500.

The seed layer 400 is arranged and has a composition to promote the orthorhombic phase of the ferroelectric gate layer 500 and to inhibit the monoclinic phase of the ferroelectric gate layer 500, such as $Hf_xZr_{1-x}O_y$ (HZO). The increased orthorhombic phase of the ferroelectric gate layer 500 may result in a higher remanent polarization $2P_r$ of the ferroelectric gate layer 500. Specifically the higher remanent polarization $2P_r$ of the ferroelectric gate layer 500 may, in some embodiments, be about 20 $\mu C/cm^2$ to 80 $\mu C/cm^2$ for a metal-ferromagnetic-metal (MFM) structure. A seed layer 400 of $ZrO_2$ may be crystallized to the O-phase at a substrate temperature of 100 to 600° C. Since the seed layer 400 may affect the O-phase, $ZrO_2$ as the seed layer can promote HZO (ferroelectric gate layer 500) O-phase crystallization and increase the (O+T+C)/(O+T+C+M) ratio, which results in higher remanent polarization $2P_r$ of the ferroelectric gate layer 500. The HfZrO may be doped with smaller ion radius elements of Al, Si, or larger ion radius elements of La, Sc, Ca, Ba, Gd, Y, Sr, etc. to increase $2P_r$.

After deposition of the ferroelectric gate layer 500, the ferroelectric gate layer 500 may be patterned. The ferroelectric gate layer 500 may be patterned before subsequent layers are formed, or alternatively, the ferroelectric gate layer 500 and subsequent layers may be patterned in the same process. The ferroelectric gate layer 500 may be patterned using a photolithographic process, for example, using patterned photoresist, and/or a patterned hard mask as an etch mask.

Figure 6:
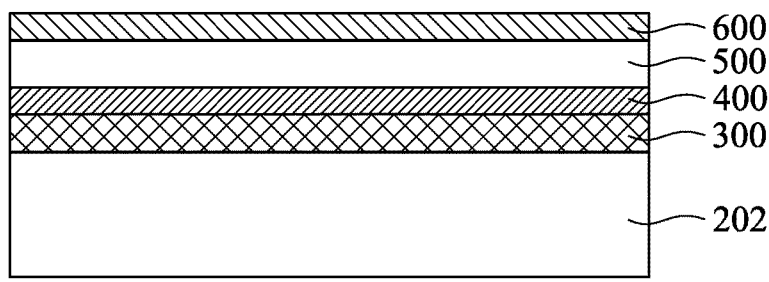

Corresponding to operation 110 of FIG. 1, FIG. 6 is a view of the semiconductor device 200 including a blocking layer 600 formed on the ferroelectric gate layer 500. The blocking layer 600 may be formed on the ferroelectric gate layer 500 by depositing the blocking layer 600, such as by a PVD or CVD process. The blocking layer 600 may be formed by, for example, an ALD process. The blocking layer 600 may be formed, for example, by ALD at a temperature, for example, of about 100 to 600° C.

Figure 7:
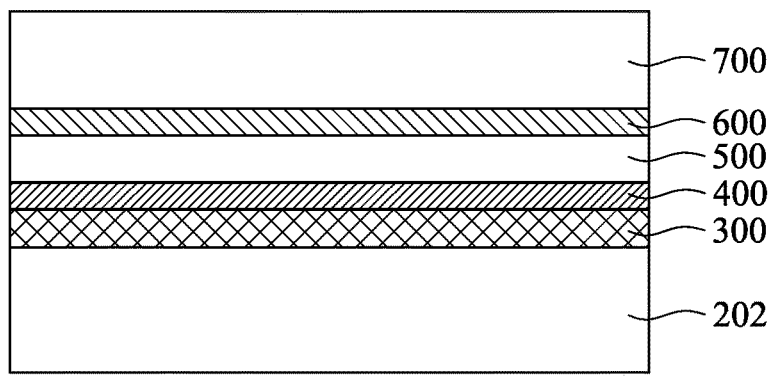

The blocking layer 600 may be formed between the ferroelectric gate layer 500 and the channel layer 700 (see FIG. 7). The blocking layer 600 is arranged and has a composition to inhibit the leakage current from the channel layer 700 and to reduce oxygen vacancies (Vo) in the channel layer 700. The lower oxygen vacancies (Vo) can reduce charge carrier scattering for the channel layer 700 and improve the Positive Bias Temperature Instability (PBTI) or Negative Bias Temperature Instability (NBTI) reliability. The blocking layer 600 may be nitridation (doped with N) to reduce surface states (which may be oxygen vacancies). The blocking layer 600 with higher conduction band offset and valence band offset can reduce leakage current form channel layer 700 and ferroelectric gate layer 500 and enhance the device endurance. The blocking layer 600 has a composition to inhibit the leakage current from the channel layer 700 by having a higher Conduction band offset ($V_{CBO}$) and Valence band offset ($V_{VBO}$) with respect to the channel layer 700 conduction and valence bands. As an example, for a channel layer 700 of amorphous InGaZnO, the blocking layer 600 may be formed of $Hf_xSi_{1-x}O_y$, where x is 0.25, $V_{CBO}$ is 3.57 eV and $V_{VBO}$ is 0.67 eV. The Si doping of the blocking layer 600 reduces oxygen vacancies of the channel layer 700, thus reducing charge carrier scattering in the channel layer 700. A blocking layer 600 of $HfO_x$ alone may result in oxygen vacancies of the channel layer 700.

The blocking layer 600 may be formed of, for example, $Hf_xZr_{1-x}O_y$, MN, or AlN:Sc. The blocking layer 600 may be formed at a thickness of between 0.1 and 10 nm, for example. The blocking layer 600 may be $HfO_2$ doped with Si, i.e., $Si:HfO_2$. The interface between the blocking layer 600 and the ferroelectric gate layer 500 may have an oxygen/Zr ratio less than 1, and may have an oxygen/Hf ratio greater than 1.

The blocking layer 600 may be $HfO_2$, or $ZrO_2$ and doped with higher bandgap materials such as $SiO_2$, $Y_2O_3$, MgO, CaO, $Al_2O_3$, $Si_3N_4$, $La_2O_3$, SrO, $ZrSiO_4$, $HfSiO_4$, and other bandgaps larger than $ZrO_2$ (5.8 eV). The blocking layer 600 may be $Hf_xZr_{1-x}O_y$ and doped with higher bandgap materials such as $SiO_2$, $Y_2O_3$, MgO, $Al_2O_3$, CaO, $Si_3N_4$, $La_2O_3$, SrO, $ZrSiO_4$, $HfSiO_4$, or other bandgaps larger than $ZrO_2$ (5.8 eV). The blocking layer 600 may be $HfO_2$, or $ZrO_2$ and doped with Nitride (N) to form $HfO_2:N$, $ZrO_2:N$ or $Hf_xZr_{1-x}O_y:N$.

After deposition of the blocking layer 600, the blocking layer 600 may be subject to a post deposition anneal (PDA). For example, the blocking layer 600 may be annealed at about 200 to 600° C. in $N_2$, for about 30 to 300 seconds.

After deposition of the blocking layer 600, the blocking layer 600 may be patterned. The blocking layer 600 may be patterned before subsequent layers are formed, or alternatively, the blocking layer 600 and subsequent layers may be patterned in the same process. The blocking layer 600 may be patterned using a photolithographic process, for example, using patterned photoresist, and/or a patterned hard mask as an etch mask.

Corresponding to operation 112 of FIG. 1, FIG. 7 is a view of the semiconductor device 200 including a channel layer 700 formed on blocking layer 600. The channel layer 700 may be formed on the blocking layer 600 by depositing the channel layer 700, such as by a PVD or CVD process. The channel layer 700 may be formed, for example, by an ALD process.

The channel layer 700 may be formed of, for example, amorphous InGaZnO, to a thickness of between 0.1 nm and 100 nm. Alternatively, the channel layer 700 may be formed of, for example, IV-IV semiconductor material such as Si and/or SiGe, III-V semiconductor material, such as GaN, GaAs or InGaAs and/or II-VI semiconductor material, such as $SnO_2$, $Ga_2O_3$, $SnO_x$, $InO_x$, ZnO, MgO, or GdO or in any binary-, ternary-/quaternary-combination. As a binary example, an example is InZnO. As a ternary example, an example is SnGaZnO, SnInZnO. As a quaternary example, an example is SnInGaZnO.

After deposition of the channel layer 700, the channel layer 700 may be patterned. The channel layer 700 may be patterned before subsequent layers are formed, or alternatively, the channel layer 700 and subsequent layers may be patterned in the same process. The channel layer 700 may be patterned using a photolithographic process, for example, using patterned photoresist, and/or a patterned hard mask as an etch mask.

Figure 8:
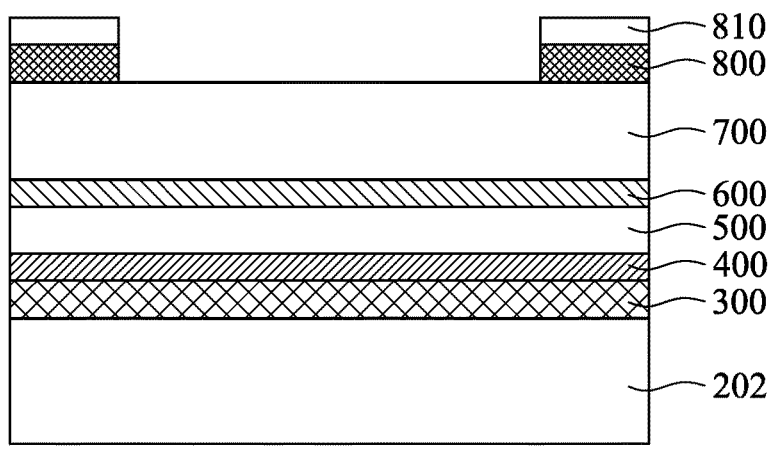

Corresponding to operation 114 of FIG. 1, FIG. 8 is a view of the semiconductor device 200 including source/drain electrodes 800 formed on the channel layer 700. The source/drain electrodes 800 may be formed on the channel layer 700 by depositing the material of the source/drain electrodes 800, such as by a PVD or CVD or ALD process. The source/drain electrodes 800 may be formed of, for example, conducting material such as doped semiconductor or metal. A metallization layer 810 may be formed on the source/drain electrodes 800, and may be deposited on the source/drain electrodes 800 by a PVD or CVD or ALD process, for example.

After deposition of the source/drain electrodes 800 and the metallization layer 810, the source/drain electrodes 800 and the metallization layer 810 may be patterned. The source/drain electrodes 800 and the metallization layer 810 may be patterned using a photolithographic process, for example, using patterned photoresist, and/or a patterned hard mask as an etch mask.

FIG. 8 illustrates a semiconductor device, which may be in two dimensional form, according to some embodiments.

Figure 9:
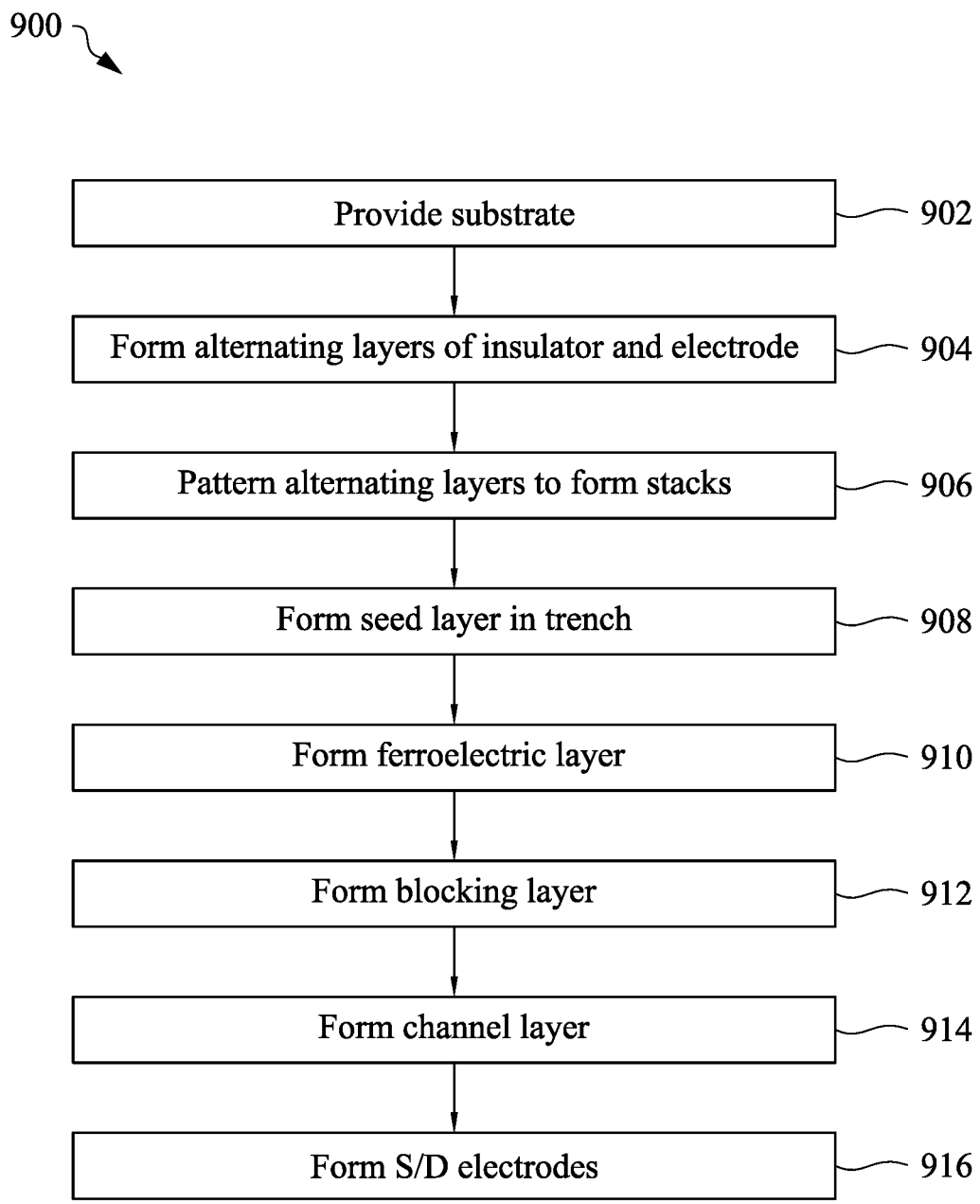
FIG. 9 illustrates a flow chart of an example method to make a semiconductor device, in accordance with some embodiments.

FIG. 9 illustrates a flowchart of a method 900 to form a semiconductor device with a ferroelectric gate layer, according to one or more embodiments of the present disclosure. For example, at least some of the operations (or steps) of the method 900 can be used to form a three-dimensional semiconductor device with a ferroelectric layer in some embodiments. It is noted that the method 900 is merely an example, and is not intended to limit the present disclosure. In some embodiments, the semiconductor device includes, at least part of, a FET FeRAM or FEFET memory, but can include other FeRAMs, MFIS, MFMIS memory structure, while remaining within the scope of the present disclosure.

Referring to FIG. 9, the method 900 starts with operation 902 in which a substrate is provided. The method 900 continues to operation 904 in which alternating layers of insulator layers and electrode (metal) layers are formed. The method 900 continues to operation 906 in which the alternating layers of insulator layers and electrode (metal) layers are patterned to form stacks of electrodes with trenches between the stacks. The method 900 continues to operation 908 in which a seed layer is formed in the trenches. The method 900 continues to operation 910 in which a ferroelectric gate layer is formed on the seed layer. The method 900 continues to operation 912 in which a blocking layer is formed on the ferroelectric gate layer. The method 900 continues to operation 914 in which a channel layer is formed on the blocking layer. The method 900 continues to operation 916 in which source and drain electrodes are formed on the channel layer.

Figure 10:
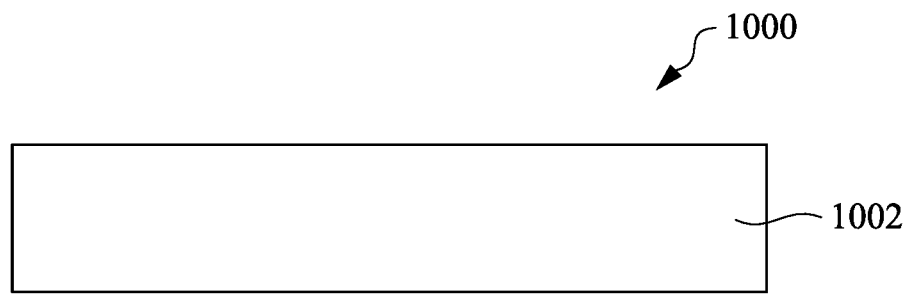
FIGS. 10-17, illustrate cross-sectional views of a semiconductor device, made by the method of FIG. 9, during various fabrication stages in accordance with some embodiments.

Corresponding to operation 902 of FIG. 9, FIG. 10 is a view of the semiconductor device 1000 including a substrate 1002 at one of the various stages of fabrication, according to some embodiments. The substrate 1002 may be a semiconductor substrate, such as a bulk semiconductor, or a semiconductor-on-insulator (SOI) substrate, for example. The substrate 1002 may be insulating, for example.

Figure 11:
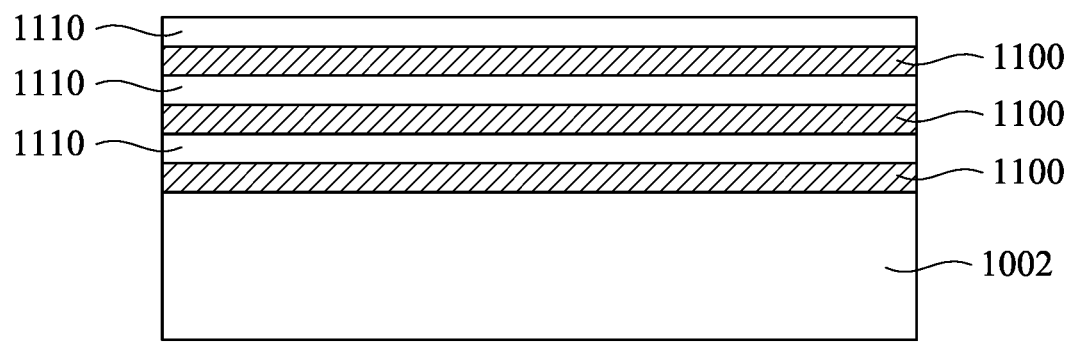

Corresponding to operation 904 of FIG. 9, FIG. 11 is a view of the semiconductor device 1000 including alternating layers of insulator layers 1110 and electrode (metal) layers 1100 formed on the substrate 1002. The electrode layers 1100 and insulator layers 1110 may be formed on the substrate 1002 by alternatingly depositing the electrode layers 1100 and the insulator layers 1110, such as by a PVD or a CVD process. The electrode layers 1100 may be formed, for example, by an ALD process. Each electrode layers 1100 may be formed of a barrier material, for example, Ti, TiN, TiC, W, $WN_x$, $WSi_x$, $WO_x$, Ru, $RuO_x$, Cu, Pt, Au, Nb, Mo, Ta or TaN. The insulator layer 1110 may be a single layer, or may be a multi-layer structure. The insulator layers 1110 may be formed of $SiO_x$, $SiN_x$, $Al_2O_3$ or a combination, for example. The insulator layers 1110 may be a single layer, or may be a multi-layer structure, for example.

Figure 12:
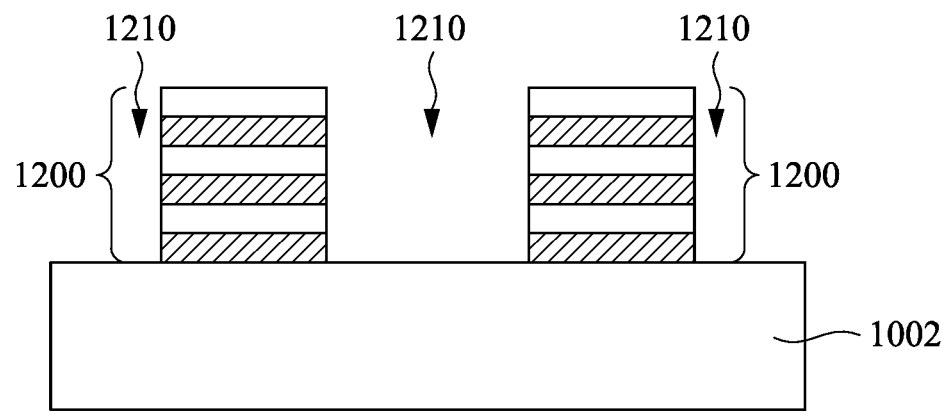

Corresponding to operation 906 of FIG. 9, FIG. 12 is a view of the semiconductor device 1000 including stacks 1200 of the alternating electrode layers 1100 and insulator layers 1110 with trenches 1210 between the stacks 1200. The trenches 1210 may be patterned, for example, using a photolithographic process, for example, using patterned photoresist, and/or a patterned hard mask as an etch mask, and etching the trenches 1210 into the alternating electrode layers 1100 and insulator layers 1110 using an appropriate etchant.

Figure 13:
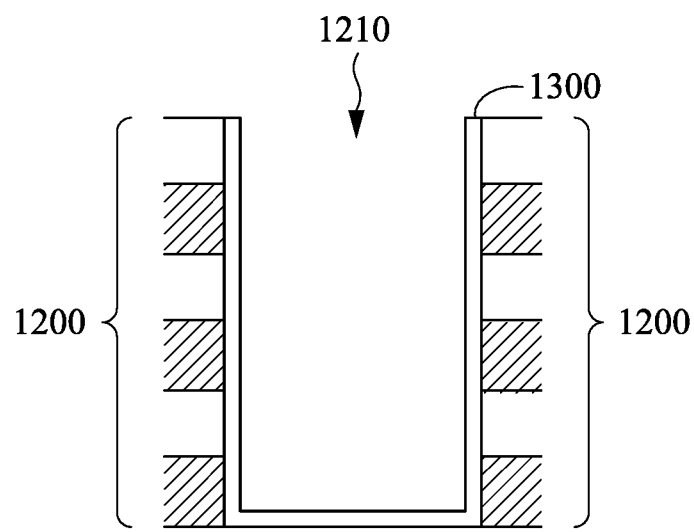

Corresponding to operation 908 of FIG. 1, FIG. 13 is a view of the semiconductor device 1000 including a seed layer 1300 formed in the trenches 1210 to contact the electrode layers 1100. The seed layer 1300 may be formed in the trenches 1210 by a deposition process, such as by a PVD or a CVD process, for example. The seed layer 1300 may be formed, for example, by an ALD process. The seed layer 1300 in FIG. 13 may have the same composition, thickness and structure as the seed layer 400 in FIG. 8 where the composition, structure and thickness of the seed layer 400 is described above with respect to FIG. 4.

After deposition of the seed layer 1300, the seed layer 1300 may be patterned, such as for example, to remove portions of the seed layer 1300 remaining on the top of the stacks 1200. The seed layer 1300 may be patterned before subsequent layers are formed, or alternatively, the seed layer 1300 and subsequent layers may be patterned in the same process. The seed layer 1300 may be patterned using a photolithographic process, for example, using patterned photoresist, and/or a patterned hard mask as an etch mask, or may be patterned using a chemical mechanical polishing (CMP) process to remove portions of the seed layer 1300 remaining on the top of the stack 1200.

Figure 14:
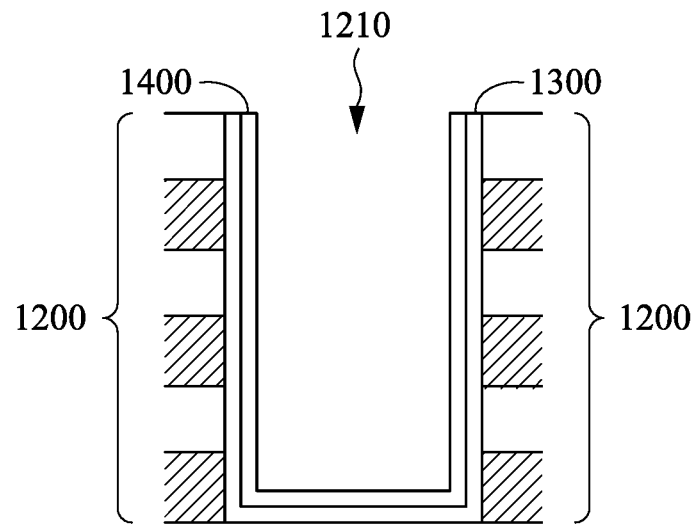

Corresponding to operation 910 of FIG. 9, FIG. 14 is a view of the semiconductor device 1000 including a ferroelectric gate layer 1400 formed on the seed layer 1300. The ferroelectric gate layer 1400 may be formed on the seed layer 1300 by depositing the ferroelectric gate layer 1400, such as by a PVD or CVD process. The ferroelectric gate layer 1400 may be formed by, for example, an ALD process. The ferroelectric gate layer 1400 may be formed, for example, by ALD at a temperature, for example, of about 100 to 600° C.

The ferroelectric gate layer 1400 of FIG. 14 may be formed of the same composition, structure and thickness as the ferroelectric gate layer 500 of FIG. 8, where the composition, structure and thickness of the ferroelectric gate layer 500 is described above with respect to FIG. 5.

After deposition of the ferroelectric gate layer 1400, the ferroelectric gate layer 1400 may be patterned, such as for example, to remove portions of the ferroelectric gate layer 1400 remaining on the top of the stack 1200. The ferroelectric gate layer 1400 may be patterned before subsequent layers are formed, or alternatively, the ferroelectric gate layer 1400 and subsequent layers may be patterned in the same process. The ferroelectric gate layer 1400 may be patterned using a photolithographic process, for example, using patterned photoresist, and/or a patterned hard mask as an etch mask, or may be patterned using a CMP process to remove portions of the ferroelectric gate layer 1400 remaining on the top of the stack 1200.

Figure 15:
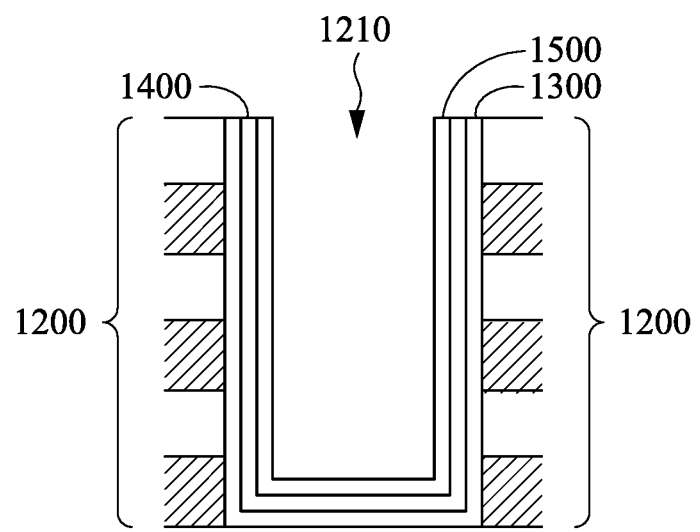

Corresponding to operation 912 of FIG. 9, FIG. 15 is a view of the semiconductor device 1000 including a blocking layer 1500 formed on the ferroelectric gate layer 1400. The blocking layer 1500 may be formed on the ferroelectric gate layer 1400 by depositing the blocking layer 1500, such as by a PVD or CVD process. The blocking layer 1500 may be formed, for example, by an ALD process. The blocking layer 1500 may be formed, for example, by ALD at a temperature, for example, of about 100 to 600° C.

The blocking layer 1500 of FIG. 15 may be formed of the same composition, structure and thickness as the blocking layer 600 of FIG. 8, where the composition, structure and thickness as the blocking layer 600 is described above with respect to FIG. 6.

After deposition of the blocking layer 1500, the blocking layer 1500 may be patterned, such as for example, to remove portions of the blocking layer 1500 remaining on the top of the stack 1200. The blocking layer 1500 may be patterned before subsequent layers are formed, or alternatively, the blocking layer 1500 and subsequent layers may be patterned in the same process. The blocking layer 1500 may be patterned using a photolithographic process, for example, using patterned photoresist, and/or a patterned hard mask as an etch mask, or may be patterned using a CMP process to remove portions of the blocking layer 1500 remaining on the top of the stack 1200.

Figure 16:
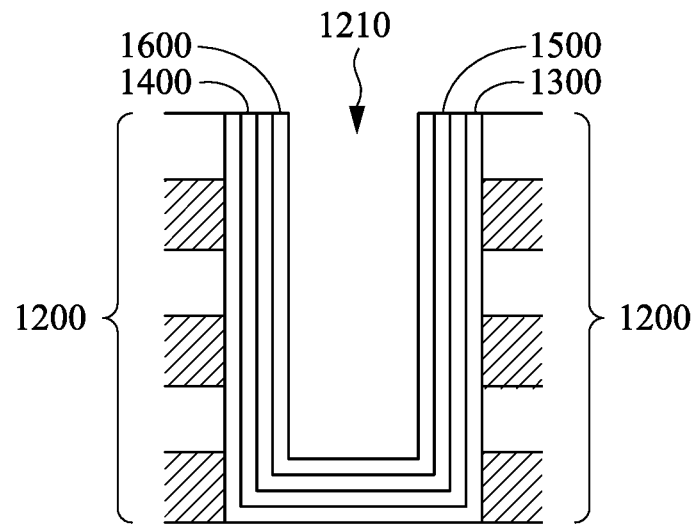

Corresponding to operation 914 of FIG. 9, FIG. 16 is a view of the semiconductor device 1000 including a channel layer 1600 formed on the blocking layer 1500. The channel layer 1600 may be formed on the blocking layer 1500 by depositing the channel layer 1600, such as by a PVD or CVD process. The channel layer 1600 may be formed by, for example, an ALD process.

The channel layer 1600 of FIG. 16 may be formed of the same composition, structure and thickness as the channel layer 700 of FIG. 8, where the composition, structure and thickness of the channel layer 700 is described above with respect to FIG. 7.

After deposition of the channel layer 1600, the channel layer 1600 may be patterned, such as for example, to remove portions of the channel layer 1600 remaining on the top of the stack 1200. The channel layer 1600 may be patterned before subsequent layers are formed, or alternatively, channel layer 1600 and subsequent layers may be patterned in the same process. The channel layer 1600 may be patterned using a photolithographic process, for example, using patterned photoresist, and/or a patterned hard mask as an etch mask, or may be patterned using a CMP process to remove portions of the channel layer 1600 remaining on the top of the stacks 1200.

Figure 17:
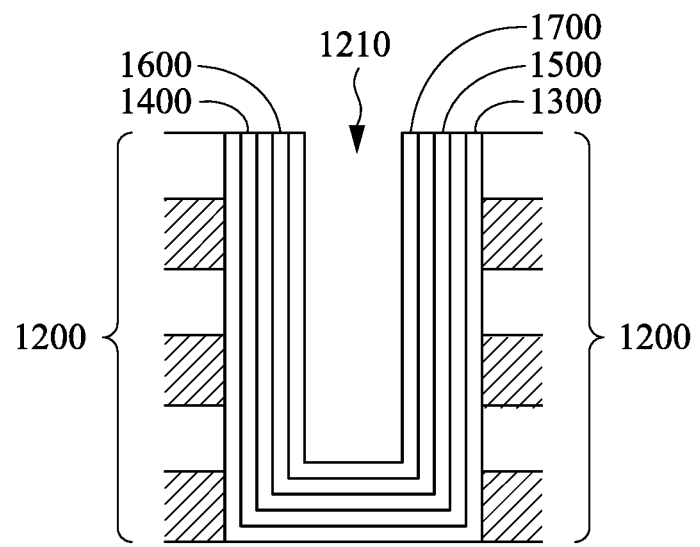

Corresponding to operation 916 of FIG. 9, FIG. 17 is a view of the semiconductor device 1000 including source/drain electrodes 1700 formed on the channel layer 1600. The source/drain electrodes 1700 may be formed on the channel layer 1600 by depositing the source/drain electrodes 1700, such as by a PVD or CVD or ALD process. The source/drain electrodes 1700 may be formed of, for example, conducting material such as doped semiconductor or metal.

After deposition of the source/drain electrodes 1700, the source/drain electrodes 1700 may be patterned, such as for example, to remove portions of the source/drain electrodes 1700 remaining on the top of the stack 1200. The source/drain electrodes 1700 may be patterned before subsequent layers are formed, or alternatively, source/drain electrodes 1700 and subsequent layers may be patterned in the same process. The source/drain electrodes 1700 may be patterned using a photolithographic process, for example, using patterned photoresist, and/or a patterned hard mask as an etch mask, or may be patterned using a CMP process to remove portions of the source/drain electrodes 1700 remaining on the top of the stacks 1200.

Figure 18:
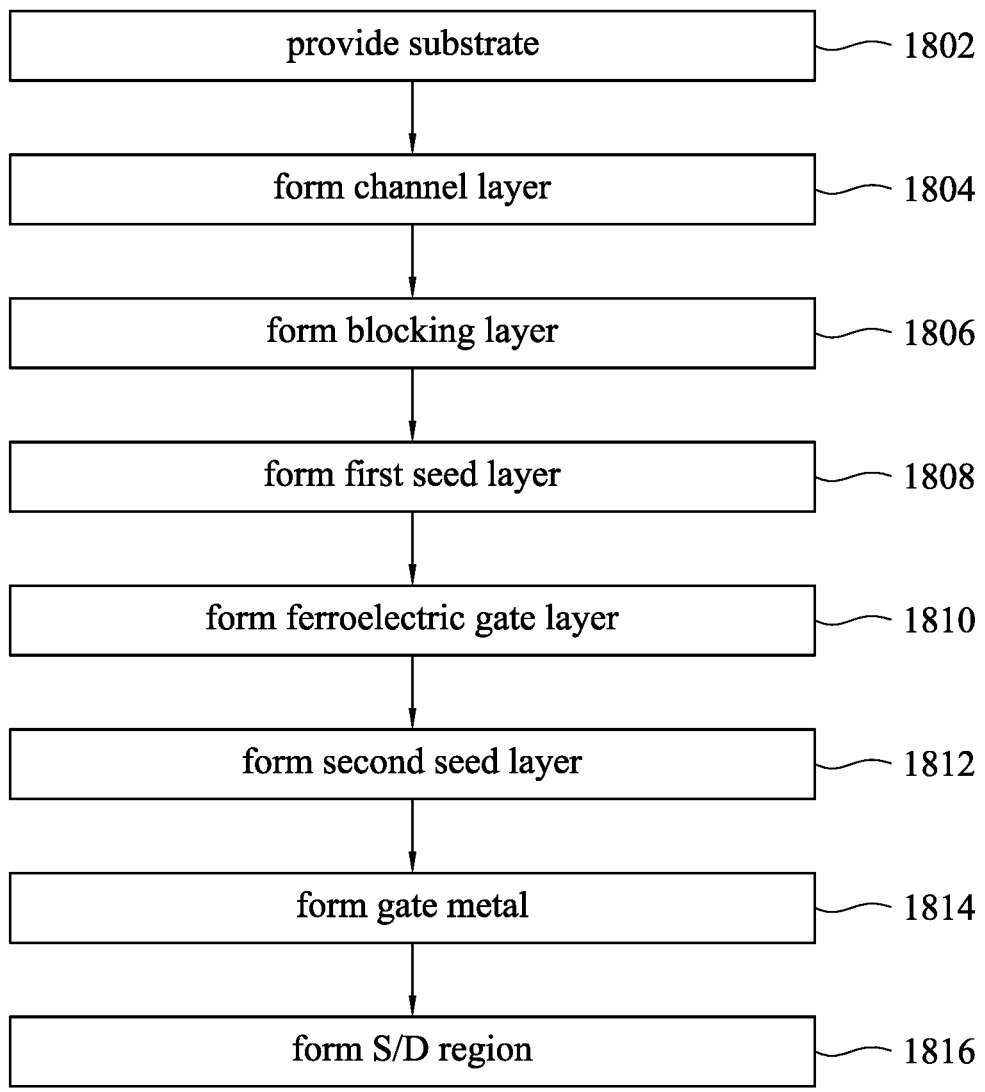
FIG. 18 illustrates a flow chart of an example method to make a semiconductor device, in accordance with some embodiments.

FIG. 18 illustrates a flowchart of a method 1800 to form a semiconductor device with a ferroelectric gate layer, according to one or more embodiments of the present disclosure. For example, at least some of the operations (or steps) of the method 1800 can be used to form a top gate semiconductor device structure.

Referring to FIG. 18, the method 1800 starts with operation 1802 in which a substrate is provided. The method 1800 continues to operation 1804 in which a channel layer is formed. The method 1800 continues to operation 1806 in which a blocking layer is formed. The method 1800 continues to operation 1808 in which a first seed layer is formed.

The method 1800 continues to operation 1810 in which a ferroelectric gate layer is formed. The method 1800 continues to operation 1812 in which a second seed layer is formed. The method 1800 continues to operation 1814 in which a gate metal layer is formed. The method 1800 continues to operation 1816 in which source/drain (S/D) regions are formed.

Figure 19:
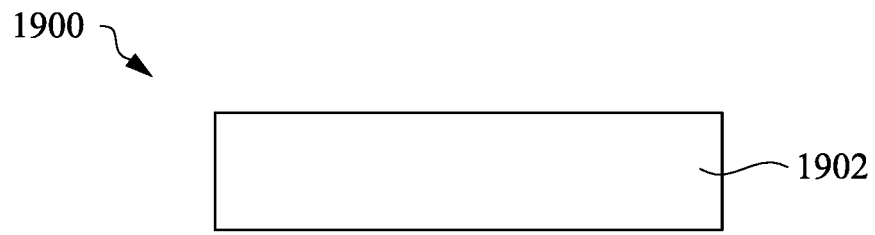
FIGS. 19-26 illustrate cross-sectional views of a semiconductor device, made by the method of FIG. 18, during various fabrication stages in accordance with some embodiments.

Corresponding to operation 1802 of FIG. 18, FIG. 19 is a view of the semiconductor device 1900 including a substrate 1902 at one of the various stages of fabrication, according to some embodiments. The substrate 1902 may be a semiconductor substrate, such as a bulk semiconductor, or a semiconductor-on-insulator (SOI) substrate, for example. The substrate 1902 may be InGaZnO or silicon for example.

Figure 20:

Corresponding to operation 1804 of FIG. 18, FIG. 20 is a view of the semiconductor device 1900 including a channel layer 2000 formed on the substrate 1902. The channel layer 2000 may be formed by doping an upper region of the substrate 1902. For example, implanting of dopant may be performed to form the channel layer 2000. Alternatively, the channel layer 2000 may be formed at least partially at the time of forming the S/D regions, where the S/D regions are formed by doping the substrate, and a channel is formed between the S/D regions.

Figure 21:
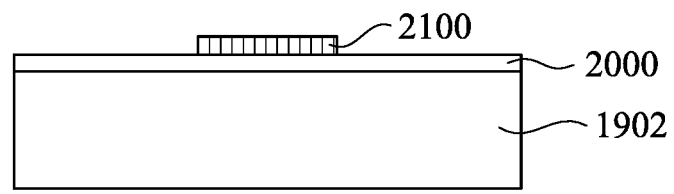
Figure 23:
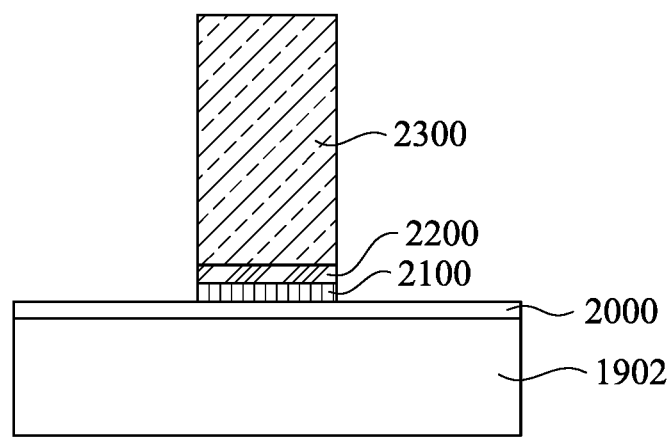

Corresponding to operation 1806 of FIG. 18, FIG. 21 is a view of the semiconductor device 1900 including blocking layer 2100 formed on the channel layer 2000 of the substrate 1902. The blocking layer 2100 is formed to be positioned between channel layer 2000 and the subsequently formed ferroelectric gate layer 2300, as shown in FIG. 23. The blocking layer 2100 may be formed in a similar manner to that of blocking layer 600 described with respect to FIG. 6.

The blocking layer 2100 may be formed on the channel layer 2000 by depositing the blocking layer 2100, such as by a PVD or CVD process. The blocking layer 2100 may be formed by, for example, by an ALD process. The blocking layer 2100 may be formed, for example, by ALD at a temperature, for example, of about 100 to 600° C.

The blocking layer 2100 may be formed between the ferroelectric gate layer 2300 and the channel layer 2000. The blocking layer 2100 is arranged and has a composition to inhibit the leakage current from the channel layer 2000 and to reduce oxygen vacancies (Vo) in the channel layer 2000. The lower oxygen vacancies (Vo) can reduce charge carrier scattering for the channel layer 2000 and improve the Positive Bias Temperature Instability (PBTI) or Negative Bias Temperature Instability (NBTI) reliability. The blocking layer 2100 may be nitridation (doped with N) to reduce surface states (which may be oxygen vacancies). The blocking layer 2100 with higher conduction band offset and valence band offset can reduce leakage current from the channel layer and enhance the device endurance. The blocking layer 2100 has a composition to inhibit the leakage current from the channel layer 2000 by having a higher Conduction band offset ($V_{CBO}$) and Valence band offset ($V_{VBO}$) with respect to the channel layer 2000 conduction and valence bands. As an example, for a channel layer 2000 of amorphous InGaZnO, the blocking layer 2100 may be formed of $Hf_xSi_{1-x}O_y$, where x is 0.25, $V_{CBO}$ is 3.57 eV and $V_{VBO}$ is 0.67 eV. The Si doping of the blocking layer 600 reduces oxygen vacancies of the channel layer 2000, thus reducing charge carrier scattering in the channel layer 2000. A blocking layer 2100 of $HfO_x$ alone may result in oxygen vacancies of the channel layer 2000.

The blocking layer 2100 may be formed of, for example, $Hf_xZr_{1-x}O_y$, AlN, or AlN:Sc. The blocking layer 2100 may be formed at a thickness of between 0.1 and 10 nm, for example. The blocking layer 2100 may be $HfO_2$ doped with Si, i.e., $Si:HfO_2$. The interface between the blocking layer 2100 and the ferroelectric gate layer 2300 may have an oxygen/Zr ratio less than 1, and may have an oxygen/Hf ratio greater than 1. The blocking layer 2100 may have an atomic ratio of silicon greater than 10 percent.

The blocking layer 2100 may be $HfO_2$, or $ZrO_2$ and doped with higher bandgap materials such as $SiO_2$, $Y_2O_3$, MgO, CaO, $Al_2O_3$, $Si_3N_4$, $La_2O_3$, SrO, $ZrSiO_4$, $HfSiO_4$, and other bandgaps larger than $ZrO_2$ (5.8 eV). The blocking layer 2100 may be $Hf_xZr_{1-x}O_y$ and doped with higher bandgap materials such as $SiO_2$, $Y_2O_3$, MgO, $Al_2O_3$, CaO, $Si_3N_4$, $La_2O_3$, SrO, $ZrSiO_4$, $HfSiO_4$, or other bandgaps larger than $ZrO_2$ (5.8 eV). The blocking layer 2100 may be $HfO_2$, or $ZrO_2$ and doped with Nitride (N) to form $HfO_2$:N, $ZrO_2$:N or $Hf_xZr_{1-x}O_y$:N. The blocking layer material can be any one of Si, Mg, Al, $Y_2O_3$, La, Sr, Gd, N, Sc, or Ca, alone or in combination. The blocking layer 2100 may include a 0.1 to 1 nm buffer layer 2110 adjacent the seed layer 2200. The buffer layer can be $Ta_2O_5$, or $HfO_2$ doped with Si, Mg, Al, $Y_2O_3$, La, Sr, Gd, N, Sc, Ca alone or in combination.

After deposition of the blocking layer 2100, the blocking layer 2100 may be subject to a post deposition anneal (PDA). For example, the blocking layer 2100 may be annealed at about 200 to 600° C. in $N_2$, for about 30 to 300 seconds.

After deposition of the blocking layer 2100, the blocking layer 2100 may be patterned. The blocking layer 2100 may be patterned before subsequent layers are formed, or alternatively, the blocking layer 2100 and subsequent layers may be patterned in the same process. The blocking layer 2100 may be patterned using a photolithographic process, for example, using patterned photoresist, and/or a patterned hard mask as an etch mask.

Figure 22:
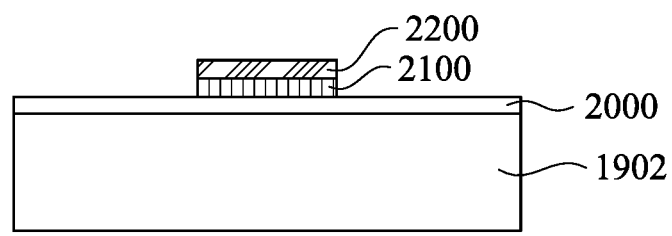

Corresponding to operation 1808 of FIG. 18, FIG. 22 is a view of the semiconductor device 1900 including first seed layer 2200 formed on blocking layer 2100. The first seed layer 2200 may be formed in the manner of seed layer 400 described above with respect to FIG. 4. The first seed layer 2200 have a single or multi-layer formation. Further, for a ferroelectric gate layer 2300 of $Hf_xZr_{1-x}O_y$, the first seed layer 2200 may have an orthorhombic crystalline phase or tetragonal crystalline phase similar to the $Hf_xZr_{1-x}O_y$ orthorhombic phase.

After deposition of the first seed layer 2200, the first seed layer 2200 may be patterned. The first seed layer 2200 may be patterned before subsequent layers are formed, or alternatively, the first seed layer 2200 and subsequent layers may be patterned in the same process. The first seed layer 2200 may be patterned using a photolithographic process, for example, using patterned photoresist, and/or a patterned hard mask as an etch mask.

Corresponding to operation 1810 of FIG. 18, FIG. 23 is a view of the semiconductor device 1900 including ferroelectric gate layer 2300 formed on first seed layer 2200. The ferroelectric gate layer 2300 may be formed in the same manner as the ferroelectric gate layer 500 described above with respect to FIG. 5.

The phase fraction relationship of the ferroelectric gate layer 2300 may be as follows where (O+T+C) is greater than 50% M, wherein O is the orthorhombic fraction of the ferroelectric gate layer, T is the tetragonal fraction of the ferroelectric gate layer 2300, C is the cubic fraction of the ferroelectric gate layer, and M is the monoclinic fraction of the ferroelectric gate layer 2300. In general, the first seed layer 2200 may be arranged to increase the ratio of (O+T+C)/(O+T+C+M) of the ferroelectric gate layer 2300.

The first seed layer 2200 is arranged and has a composition to promote the orthorhombic phase of the ferroelectric gate layer 2300 and to inhibit the monoclinic phase of the ferroelectric gate layer 2300, such as $Hf_xZr_{1-x}O_y$ (HZO). The increased orthorhombic phase of the ferroelectric gate layer 2300 may result in a higher remanent polarization $2P_r$ of the ferroelectric gate layer 2300. Specifically the higher remanent polarization $2P_r$ of the ferroelectric gate layer 2300 may, in some embodiments, be about 20 $\mu C/cm^2$ to 80 $\mu C/cm^2$ for a metal-ferromagnetic-metal (MFM) structure. A first seed layer 2200 of $ZrO_2$ may be crystallized to the O-phase at a substrate temperature of 100 to 600° C. Since the first seed layer 2200 may affect the O-phase, $ZrO_2$ as the seed layer can promote HZO (ferroelectric gate layer 2300) O-phase crystallization and increase the (O+T+C)/(O+T+C+M) ratio, which results in higher remanent polarization $2P_r$ of the ferroelectric gate layer 2300.

The first seed layer 2200 layer crystalline phase will depend upon the material. For example, the first seed layer 2200 layer may comprise (1) (cubic-phase and/or t-phase and/or o-phase Zr oxide); (2) (cubic-phase and/or t-phase and/or o-phase Zr—Y oxide, such as (cubic- and/or t-phase and/or o-phase $ZrO_2$), (cubic-phase and/or t-phase and/or o-phase $ZrO_2$—$Y_2O_3$)); (3) (c-phase, t-phase and/or o-phase $HfO_2$); (4) (c-phase, t-phase and/or o-phase $Al_2O_3$); or (5) (c-, t-phase and/or o-phase $Hf_xZr_{1-x}O_y$, the x can be varied from 0 to 1); or any combination of above. The first seed layer 2200 can be 0.1 nm to 5 nm thickness and formed using in-situ thermal annealing at 400~700° C. for 1 minute to 5 minutes. In-situ thermal annealing can be performed by substrate heating or embedded IR heating kits around a formation chamber.

Figure 24:
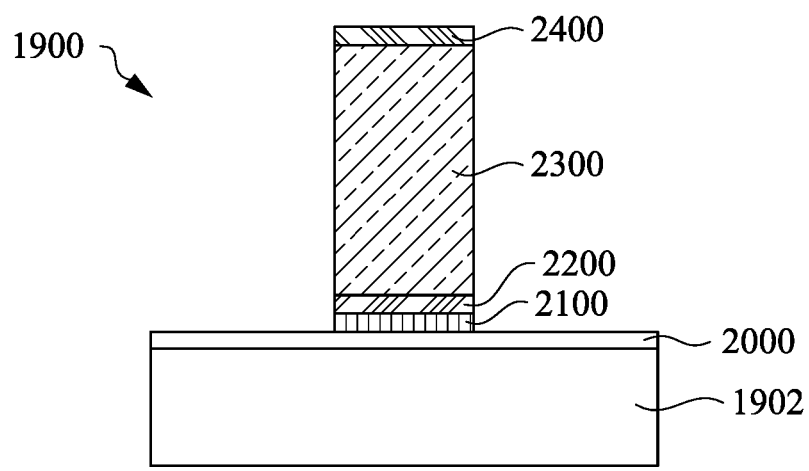

Corresponding to operation 1812 of FIG. 18, FIG. 24 is a view of the semiconductor device 1900 including a second seed layer 2400 formed on the ferroelectric gate layer 2300. The second seed layer 2400 may be formed in a same manner and same functionality as the first seed layer 2200 except that the first seed layer 2200 is formed below the ferroelectric gate layer 2300 and the second seed layer 2400 is formed above the ferroelectric gate layer 2300.

Figure 25:
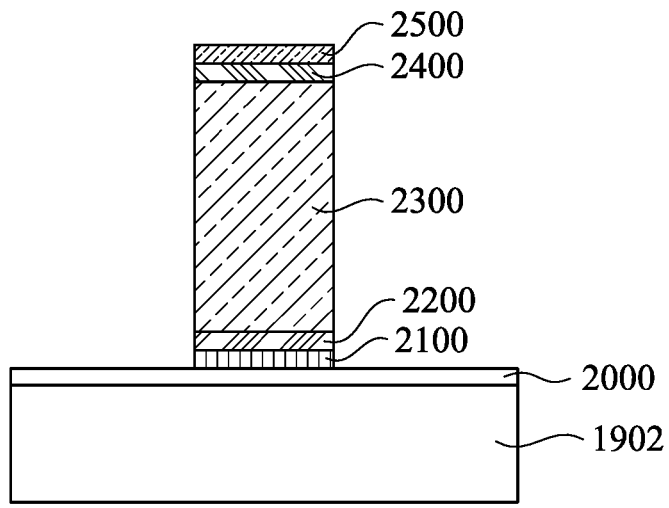

Corresponding to operation 1814 of FIG. 18, FIG. 25 is a view of the semiconductor device 1900 including a gate metal 2500 formed on the second seed layer 2400, or on the ferroelectric gate layer 2300 if the second seed layer 2400 is omitted. The gate metal 2500 may be formed by CVD or PVD, for example. The gate metal 2500 may be formed of Pt, Ti, TiN, Ta, TaN, W, Fe, Ti, Ni, Be, Cr, Cobalt (Co), antimony (Sb), Iridium (Ir), Molybedem (Mo), Osmium (Os), Thorium, Vanadium, or combinations thereof. The gate metal 2500 may be formed of a metal with a smaller coefficient of thermal expansion than HZO to provide tensile stress electrodes.

After deposition, the gate metal 2500 may be annealed to enhance stress and ferroelectric gate layer crystallinity. The post deposition anneal may be performed at, for example, between 400 and 900° C. The gate metal 2500 may be patterned, for example, by photolithography before or after patterning of subsequent layers.

Figure 26:
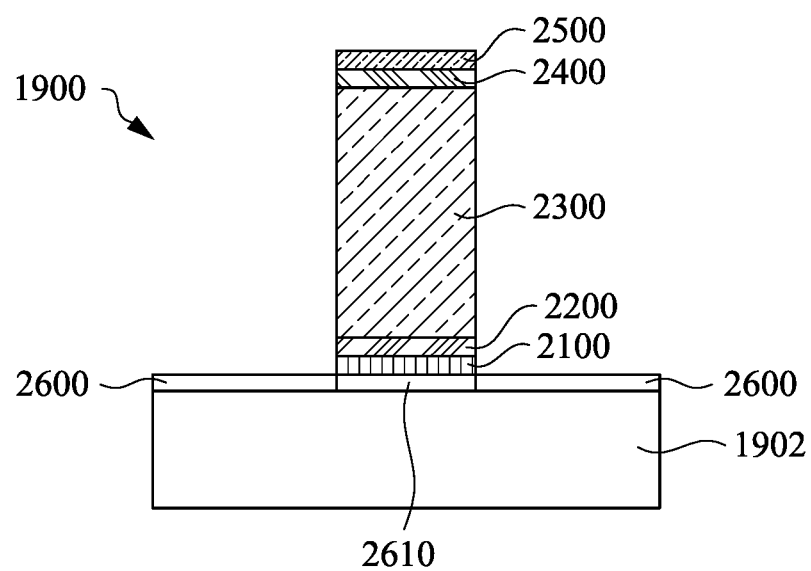

Corresponding to operation 1816 of FIG. 18, FIG. 26 is a view of the semiconductor device 1900 including the formation of S/D regions 2600 on either side of a channel 2610 of the channel layer 2000. The S/D regions 2600 may be formed, for example, using an implant mask covering the layers formed including the gate metal 2500. The implant mask may be a hard mask, for example, such as silicon nitride. After implanting, the implant mask may be removed.

Dopant may be implanted into the channel layer 2000 using the implant mask to form the S/D regions 2600 adjacent the channel 2610. The conductivity type of the dopant may depend on the device desired, i.e., n-type or p-type.

In one aspect of the present disclosure, a semiconductor device is disclosed. The semiconductor device comprises a substrate and a metal layer disposed on the substrate. A seed layer is formed on the metal layer. A ferroelectric gate layer is formed on the seed layer. A channel layer is formed over the ferroelectric gate layer. The seed layer is arranged to increase the orthorhombic phase fraction of the ferroelectric gate layer.

In another aspect of the present disclosure, a semiconductor device is disclosed. The semiconductor device includes a substrate and a metal layer disposed on the substrate. A ferroelectric gate layer is formed over the metal layer. A blocking layer is disposed on the ferroelectric gate layer. A channel layer is formed on the blocking layer, and the blocking layer is arranged to increase the band offset between the blocking layer and the channel layer, and to reduce oxygen vacancies in the channel layer.

In another aspect of the present disclosure, a ferroelectric semiconductor device is disclosed. A blocking layer is disposed on a channel of the substrate. A first seed layer is disposed on the blocking layer. A ferroelectric gate layer is formed on the first seed layer. An electrode is formed over the ferroelectric gate layer. The first seed layer is arranged to increase the orthorhombic phase fraction of the ferroelectric gate layer, the blocking layer arranged to increase the band offset between the channel and the blocking layer, and to reduce oxygen vacancies between blocking layer and channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric semiconductor device, comprising:
a substrate;
a blocking layer disposed on a channel of the substrate;
a first seed layer disposed on the blocking layer;
a ferroelectric gate layer formed on the first seed layer; and
an electrode formed over the ferroelectric gate layer;
wherein the first seed layer is arranged to increase an orthorhombic phase fraction of the ferroelectric gate layer and the blocking layer is arranged to increase a band offset between the channel and the blocking layer and to reduce oxygen vacancies between the blocking layer and the channel.

2. The ferroelectric semiconductor device of claim 1, further comprising a second seed layer disposed on the ferroelectric gate layer, the second seed layer arranged to increase the orthorhombic phase fraction of the ferroelectric gate layer.

3. The ferroelectric semiconductor device of claim 2, wherein the electrode is disposed on the second seed layer.

4. The ferroelectric semiconductor device of claim 1, wherein the first seed layer is arranged to increase a ratio of (O+T+C)/(O+T+C+M), wherein O is the orthorhombic fraction of the ferroelectric gate layer, T is the tetragonal fraction of the ferroelectric gate layer, C is the cubic fraction of the ferroelectric gate layer, and M is the monoclinic fraction of the ferroelectric gate layer.

5. The ferroelectric semiconductor device of claim 1, wherein a thickness of the ferroelectric gate layer is 0.1 to 100 nm.

6. The ferroelectric semiconductor device of claim 1, wherein the blocking layer is doped with Si.

7. The ferroelectric semiconductor device of claim 1, wherein the semiconductor device has a three dimensional structure.

8. The ferroelectric semiconductor device of claim 1, wherein the first seed layer includes at least one of $ZrO_2$, $Y_2O_3$, $HfO_2$, $Ta_2O_5$, or $Al_2O_3$.

9. The ferroelectric semiconductor device of claim 1, wherein the first seed layer includes a bi-layer including an amorphous buffer layer and a crystalline layer.

10. The ferroelectric semiconductor device of claim 1, wherein the blocking layer includes at least one of $HfSiO_4$, $ZrSiO_4$, $Si_3N_4$, $SiO_2$, $HfO_2$ or $ZrO_2$.

11. The ferroelectric semiconductor device of claim 10, wherein the blocking layer is doped with at least one of Si, Mg, Al, Ca, La, Sr, Gd, N, Sc, or Y, Zr, or compounds thereof.

12. The ferroelectric semiconductor device of claim 11, wherein the blocking layer is doped with Si.

13. A ferroelectric semiconductor device, comprising:
a substrate;
a channel formed in the substrate
a first seed layer disposed over the channel;
a ferroelectric gate layer formed on the first seed layer; and
an electrode formed over the ferroelectric gate layer,
wherein the first seed layer is arranged to increase an orthorhombic phase fraction of the ferroelectric gate layer; and
further comprising a second seed layer disposed on the ferroelectric gate layer, the second seed layer arranged to increase the orthorhombic phase fraction of the ferroelectric gate layer.

14. The ferroelectric semiconductor device of claim 13, further comprising a gate metal disposed on the second seed layer.

15. The ferroelectric semiconductor device of claim 14, wherein the gate metal is disposed on the second seed layer.

16. The ferroelectric semiconductor device of claim 13, wherein the first seed layer is arranged to increase a ratio of (O+T+C)/(O+T+C+M), wherein O is the orthorhombic fraction of the ferroelectric gate layer, T is the tetragonal fraction of the ferroelectric gate layer, C is the cubic fraction of the ferroelectric gate layer, and M is the monoclinic fraction of the ferroelectric gate layer.

17. The ferroelectric semiconductor device of claim 13, wherein the first seed layer includes at least one of $ZrO_2$, $Y_2O_3$, $HfO_2$, $Ta_2O_5$, or $Al_2O_3$.

18. A ferroelectric semiconductor device, comprising:
a substrate;
a blocking layer disposed on a channel of the substrate;
a ferroelectric gate layer disposed over the blocking layer;
a seed layer disposed on the ferroelectric gate layer; and
an electrode formed over the ferroelectric gate layer,
wherein the seed layer is arranged to increase an orthorhombic phase fraction of the ferroelectric gate layer and the blocking layer is arranged to increase the band offset between the channel and the blocking layer and to reduce oxygen vacancies between the blocking layer and the channel.

19. The ferroelectric semiconductor device of claim 18, wherein the first seed layer is arranged to increase the ratio of (O+T+C)/(O+T+C+M), wherein O is the orthorhombic fraction of the ferroelectric gate layer, T is the tetragonal fraction of the ferroelectric gate layer, C is the cubic fraction of the ferroelectric gate layer, and M is the monoclinic fraction of the ferroelectric gate layer.

20. The ferroelectric semiconductor device of claim 18, wherein the ferroelectric gate layer includes $Hf_xZr_{1-x}O$ (x from 0 to 1).

* * * * *